(12) United States Patent
Aiso

(10) Patent No.: US 9,142,561 B2
(45) Date of Patent: Sep. 22, 2015

(54) NONVOLATILE SEMICONDUCTOR MEMORY DEVICE AND METHOD FOR MANUFACTURING SAME

(71) Applicant: Kabushiki Kaisha Toshiba, Minato-ku (JP)

(72) Inventor: Fumiki Aiso, Mie-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/018,515

(22) Filed: Sep. 5, 2013

(65) Prior Publication Data

US 2014/0246717 A1  Sep. 4, 2014

Related U.S. Application Data

(60) Provisional application No. 61/772,051, filed on Mar. 4, 2013.

(51) Int. Cl.
| | |
|---|---|
| *H01L 29/788* | (2006.01) |
| *H01L 27/115* | (2006.01) |
| *H01L 29/423* | (2006.01) |
| *H01L 29/66* | (2006.01) |

(52) U.S. Cl.
CPC .... *H01L 27/11521* (2013.01); *H01L 29/42324* (2013.01); *H01L 29/42328* (2013.01); *H01L 29/66825* (2013.01); *H01L 29/7881* (2013.01)

(58) Field of Classification Search
CPC .................................................. H01L 29/42328
USPC .................................................. 257/320, 757
See application file for complete search history.

(56) References Cited

U.S. PATENT DOCUMENTS

| | | | |
|---|---|---|---|
| 5,986,301 A | 11/1999 | Fukushima et al. | |
| 7,635,891 B2 * | 12/2009 | Natori et al. | 257/324 |
| 7,880,306 B2 | 2/2011 | Satou | |
| 7,906,806 B2 | 3/2011 | Rosmeulen | |

FOREIGN PATENT DOCUMENTS

| | | |
|---|---|---|
| JP | 09-139480 A | 5/1997 |
| JP | 2008-251570 A | 10/2008 |
| JP | 2009-141354 A | 6/2009 |

* cited by examiner

*Primary Examiner* — Chandra Chaudhari
(74) *Attorney, Agent, or Firm* — Oblon, McClelland, Maier & Neustadt, L.L.P.

(57) ABSTRACT

According to one embodiment, a nonvolatile semiconductor memory device includes: a plurality of first semiconductor regions; a plurality of control gate electrodes; a charge storage layer; a first insulating film provided between the charge storage layer and first semiconductor regions; a second insulating film provided between the charge storage layer and control gate electrodes; and an element isolation region provided between the plurality of first semiconductor regions, and the element isolation region being in contact with the first insulating film and a first portion of the charge storage layer on the first insulating film side. Each of the plurality of control gate electrodes is in contact with a second portion other than the first portion of the charge storage layer. The charge storage layer includes a silicon-containing layer in contact with the first insulating film and a silicide-containing layer provided on the silicon-containing layer.

6 Claims, 17 Drawing Sheets

NONVOLATILE SEMICONDUCTOR MEMORY DEVICE AND METHOD FOR MANUFACTURING SAME

CROSS-REFERENCE TO RELATED APPLICATIONS

This application is based upon and claims the benefit of priority from U.S. Provisional Patent Application 61/772,051, filed on Mar. 4, 2013; the entire contents of which are incorporated herein by reference.

FIELD

Embodiments described herein relate generally to a nonvolatile semiconductor memory device and a method for manufacturing same.

BACKGROUND

In a nonvolatile semiconductor memory device typified by a NAND flash memory, while miniaturization is progressing, the element isolation region is configured to have a prescribed depth to ensure the electrical insulation between elements.

However, with the progress of miniaturization, the width of the floating gate becomes narrower. Hence, there is a problem that depletion of the upper portion of the floating gate is likely to occur and the stability of writing and the stability of reading are not sufficient. Thus, a nonvolatile semiconductor memory device is desired that is good in the stability of writing and the stability of reading even when miniaturization progresses.

DETAILED DESCRIPTION

Figure 1:
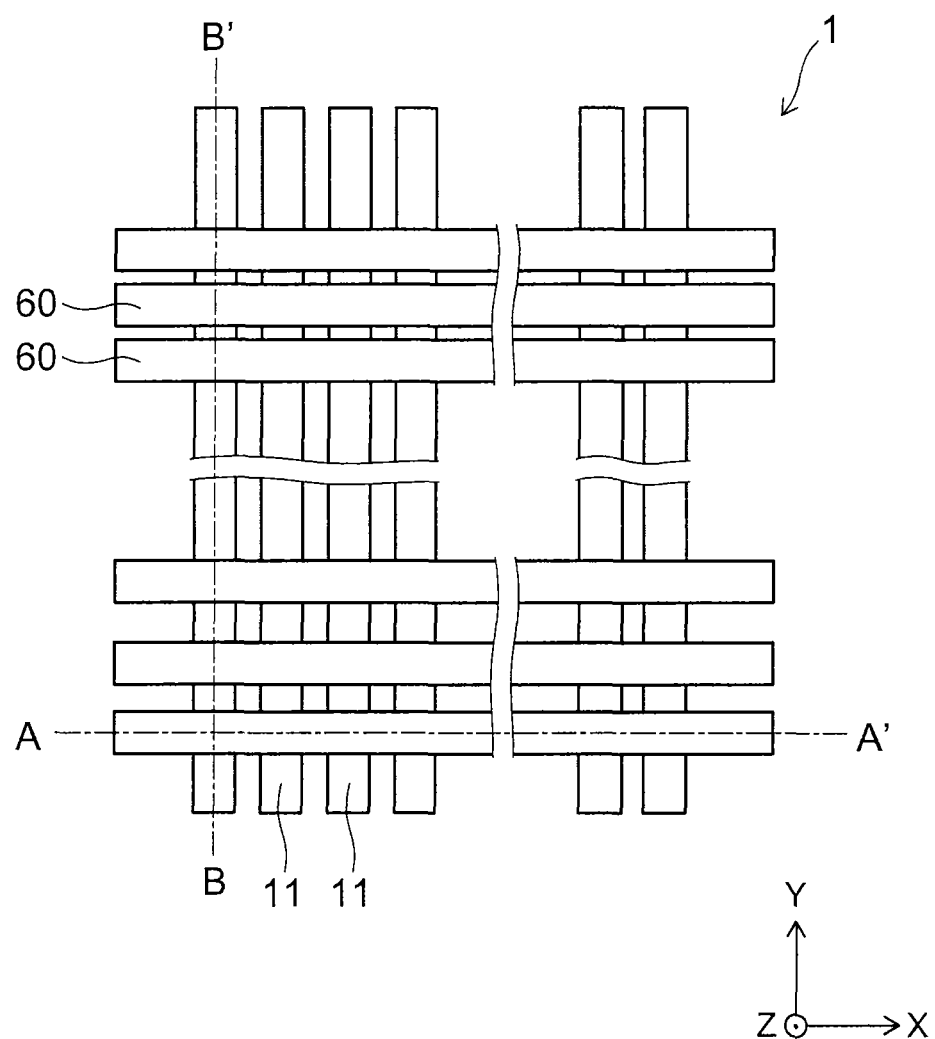
FIG. 1 is a schematic plan view showing a nonvolatile semiconductor memory device according to a first embodiment.

In general, according to one embodiment, a nonvolatile semiconductor memory device includes: a plurality of first semiconductor regions extending in a first direction, and the plurality of first semiconductor regions being arranged in a direction crossing the first direction; a plurality of control gate electrodes provided on an upper side of the plurality of first semiconductor regions, the plurality of control gate electrodes extending in a second direction different from the first direction, and the plurality of control gate electrodes being arranged in a direction crossing the second direction; a charge storage layer provided in a position, and each of the plurality of first semiconductor regions and each of the plurality of control gate electrodes cross in the position; a first insulating film provided between the charge storage layer and each of the plurality of first semiconductor regions; a second insulating film provided between the charge storage layer and each of the plurality of control gate electrodes; and an element isolation region provided between adjacent ones of the plurality of first semiconductor regions, and the element isolation region being in contact with the first insulating film and a first portion of the charge storage layer on the first insulating film side.

Each of the plurality of control gate electrodes is in contact with a second portion other than the first portion of the charge storage layer via the second insulating film. The charge storage layer includes a silicon-containing layer in contact with the first insulating film and a silicide-containing layer provided on the silicon-containing layer.

Hereinbelow, embodiments are described with reference to the drawings. In the following description, identical components are marked with the same reference numerals, and a description of components once described is omitted as appropriate.

First Embodiment

FIG. 1 is a schematic plan view showing a nonvolatile semiconductor memory device according to a first embodiment.

Figure 2A:
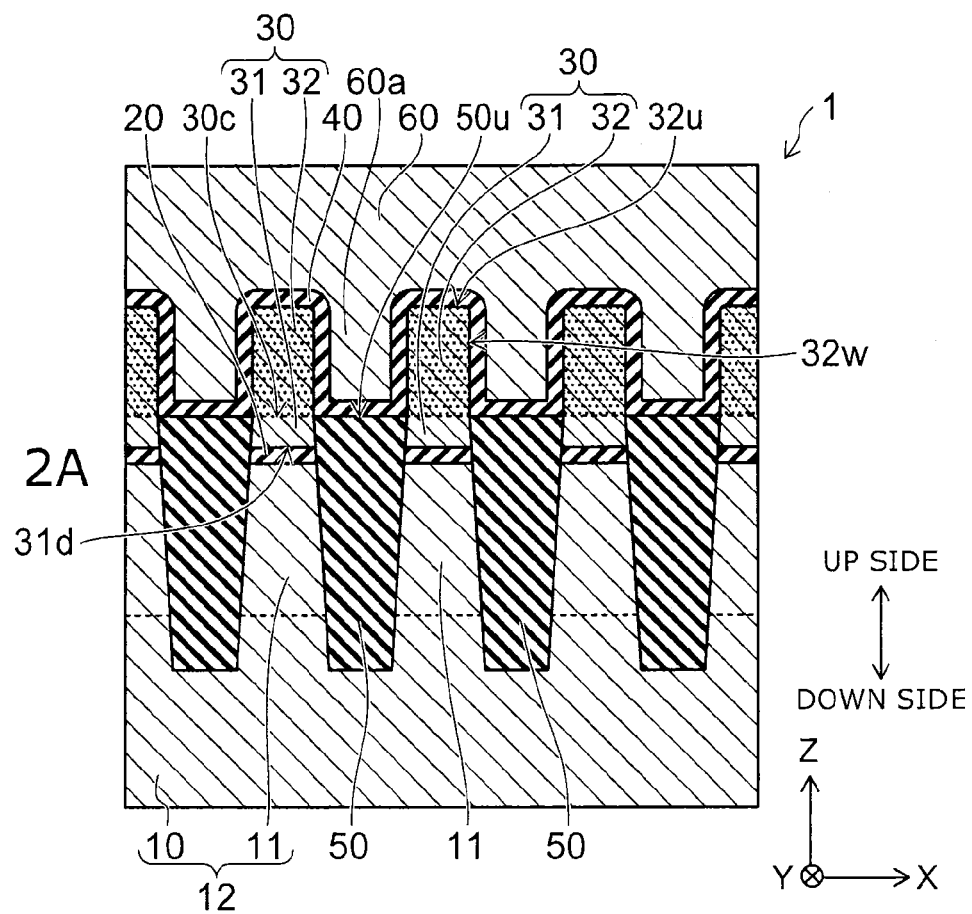
FIG. 2A is a schematic cross-sectional view showing the nonvolatile semiconductor memory device in the position of line A-A' of FIG. 1.
Figure 2B:
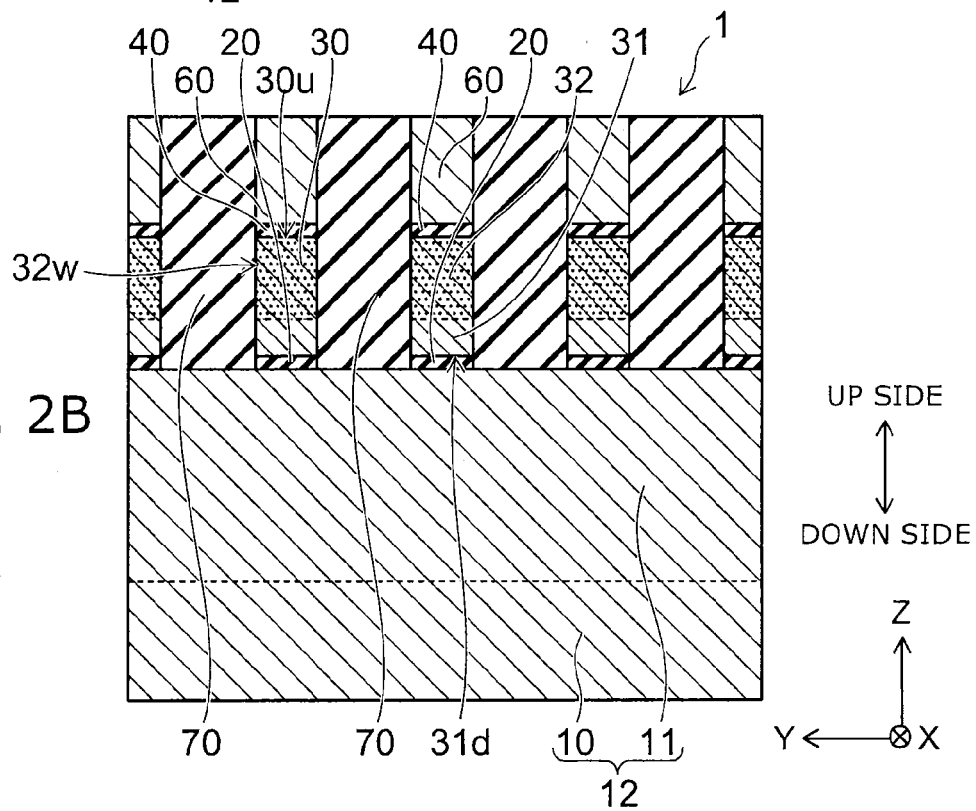
FIG. 2B is a schematic cross-sectional view showing the nonvolatile semiconductor memory device in the position of line B-B' of FIG. 1.

FIG. 2A is a schematic cross-sectional view showing the nonvolatile semiconductor memory device in the position of line A-A' of FIG. 1, and FIG. 2B is a schematic cross-sectional view showing the nonvolatile semiconductor memory device in the position of line B-B' of FIG. 1. In FIG. 2A and FIG. 2B, the positive direction of the Z axis is set upward and the negative direction is set downward.

Figure 3:
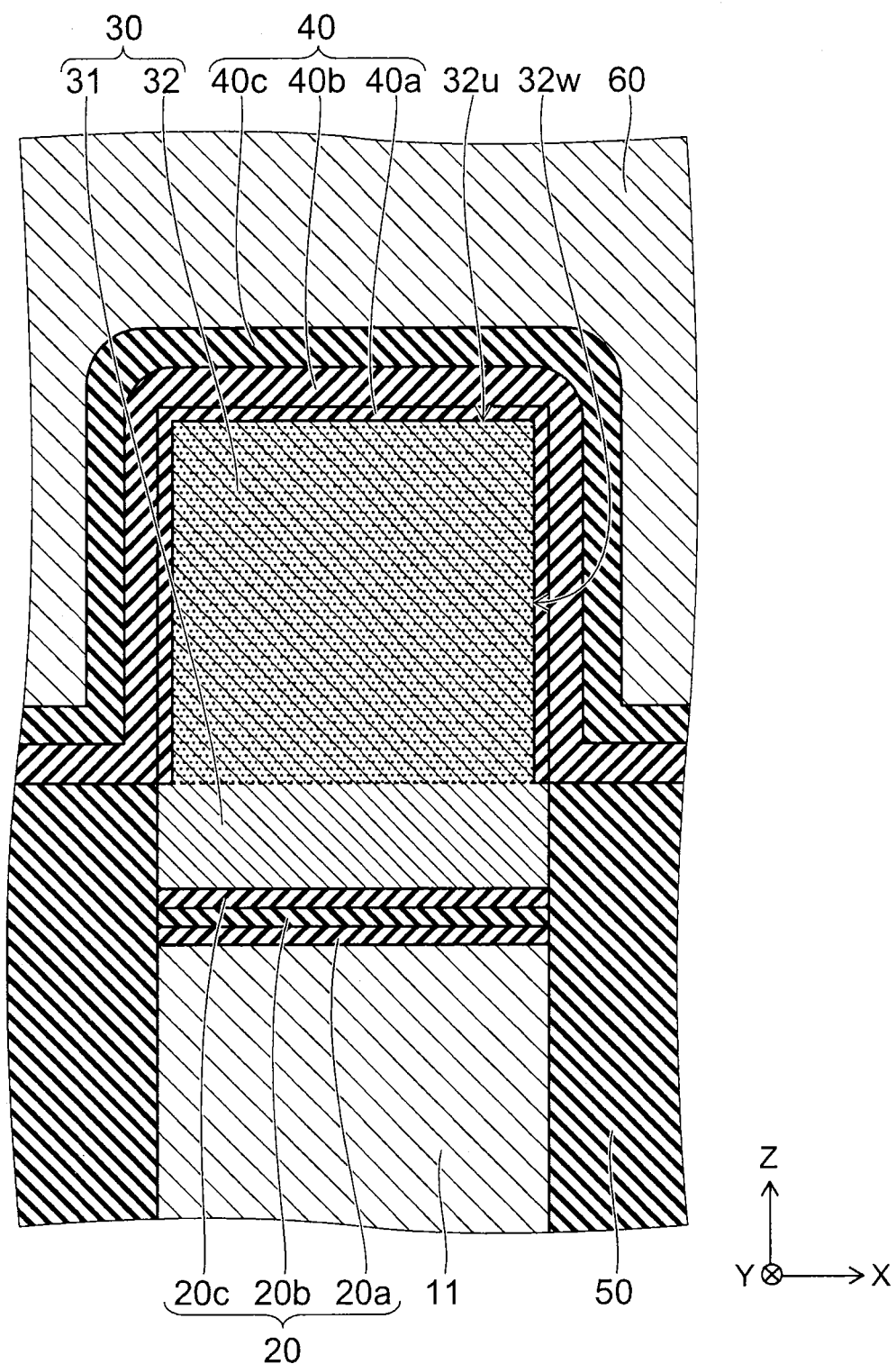
FIG. 3 is an enlarged schematic cross-sectional view of a charge storage layer and the surroundings of the charge storage layer of FIG. 2A.

FIG. 3 is an enlarged schematic cross-sectional view of a charge storage layer and the surroundings of the charge storage layer of FIG. 2A.

As shown in FIG. 1, a nonvolatile semiconductor memory device 1 includes a plurality of semiconductor regions 11 (first semiconductor regions) and a plurality of control gate electrodes 60.

Each of the plurality of semiconductor regions 11 extends in the Y direction (a first direction). The plurality of semiconductor regions 11 are arranged in a direction (e.g. the X direction) crossing the Y direction. The conductivity type of the plurality of semiconductor regions 11 is, for example, the p type.

Each of the plurality of control gate electrodes 60 is provided on the upper side of the plurality of semiconductor regions 11. Each of the plurality of control gate electrodes 60 extends in the X direction (a second direction) different from the Y direction. The plurality of control gate electrodes 60 are arranged in a direction (e.g. the Y direction) crossing the X direction.

The plurality of control gate electrodes 60 are provided on the upper side of the plurality of semiconductor regions 11. In the nonvolatile semiconductor memory device 1, each of the plurality of semiconductor regions 11 and each of the plurality of control gate electrodes 60 cross.

A transistor is disposed in the position where each of the plurality of semiconductor regions 11 and each of the plurality of control gate electrodes 60 cross. The transistor is described later. The transistors are arranged two-dimensionally in the X direction and the Y direction. Each transistor functions as a memory cell of the nonvolatile semiconductor memory device 1.

As shown in FIG. 2A and FIG. 2B, the nonvolatile semiconductor memory device 1 includes the semiconductor region 11, the control gate electrode 60, a charge storage layer 30, a gate insulating film 20 (a first insulating film), an IPD (inter poly dielectric) film 40 (a second insulating film), an element isolation region 50, a semiconductor region 10, and an insulating layer 70. The conductivity type of the semiconductor region 10 is the n type. The charge storage layer 30 may be referred to as a floating gate layer 30. The control gate electrode 60 may be referred to as a word line 60. The IPD film 40 may be referred to as a charge block film 40. The semiconductor region 10 and the semiconductor region 11 are collectively referred to as a semiconductor layer 12.

In the nonvolatile semiconductor memory device 1, the semiconductor region 11, the gate insulating film 20, the charge storage layer 30, the IPD film 40, and the control gate electrode 60 constitute a transistor. The transistor is provided in the position where the semiconductor region 11 and the control gate electrode 60 cross.

Each of the plurality of semiconductor regions 11 forms part of a NAND string. Each of the plurality of semiconductor regions 11 is separated by the element isolation region 50. Each of the plurality of semiconductor regions 11 is defined by the element isolation region 50 in the semiconductor layer 12. Each of the plurality of semiconductor regions 11 functions as an active area of the transistor.

The charge storage layer 30 is provided in the position where each of the plurality of semiconductor regions 11 and each of the plurality of control gate electrodes 60 cross. The charge storage layer 30 is in a rectangular shape extending in the Z direction in the A-A' cross section and the B-B' cross section shown in FIG. 2A and FIG. 2B. Thus, the charge storage layer 30 has a prismatic shape extending in the Z direction. The charge storage layer 30 can store a charge that has tunneled from the semiconductor region 11 via the gate insulating film 20.

Here, the charge storage layer 30 includes a silicon-containing layer 31 in contact with the gate insulating film 20 and a silicide-containing layer 32 provided on the silicon-containing layer 31.

The resistivity of the silicide-containing layer 32 is lower than the resistivity of the silicon-containing layer 31. The silicon-containing layer 31 includes, for example, a polysilicon (poly-Si) layer doped with an impurity element such as boron (B). The silicide-containing layer 32 includes a layer of a silicide made out of polysilicon doped with an impurity element such as boron (B). As the metal for making a silicide out of polysilicon, for example, at least one metal selected from titanium (Ti), nickel (Ni), cobalt (Co), molybdenum (Mo), and tungsten (W) is given.

The length from the lower end 31*d* of the silicon-containing layer 31 to the upper end 50*u* of the element isolation region 50 is the same as the length from the lower end 31*d* of the silicon-containing layer 31 to the junction 30*c* between the silicon-containing layer 31 and the silicide-containing layer 32 (corresponding to the thickness of the silicon-containing layer 31 in the Z direction). For example, the height of the upper end 50*u* of the element isolation region 50 is the same as the height of the junction 30*c*.

The width of the silicide-containing layer 32 in a direction (e.g. the X direction) crossing the Y direction is, for example, 5 nm (nanometers) or less.

The gate insulating film 20 is provided between the charge storage layer 30 and each of the plurality of semiconductor regions 11. The gate insulating film 20 functions as a tunnel insulating film through which a charge (e.g. electrons) tunnels between the semiconductor region 11 and the charge storage layer 30.

The IPD film 40 is provided between the charge storage layer 30 and each of the plurality of control gate electrodes 60. The element isolation region 50 is provided between adjacent ones of the plurality of semiconductor regions 11. The IPD film 40 covers the upper surface 30*u* of the charge storage layer 30. The IPD film 40 further covers part of the side wall 32*w* of the charge storage layer 30.

Each of the plurality of control gate electrodes 60 is in contact with the charge storage layer 30 via the IPD film 40. For example, as shown in FIG. 2A, the control gate electrode 60 is in contact with, via the IPD film 40, a portion of the charge storage layer 30 other than a portion of the charge storage layer 30 with which the element isolation region 50 is in contact. In other words, each of the plurality of control gate electrodes 60 has an extending portion 60*a* in contact with the charge storage layer 30 via the IPD film 40. Adjacent ones of the plurality of extending portions 60*a* sandwiches the charge storage layer 30.

That is, the control gate electrode 60 covers part of the charge storage layer 30 via the IPD film 40. For example, the control gate electrode 60 covers the upper surface 30*u* and part of the side wall 32*w* of the charge storage layer 30 via the IPD film 40 (see FIG. 2A). The control gate electrode 60 covers the upper surface 30*u* of the charge storage layer 30 via the IPD film 40 (see FIG. 2B). The control gate electrode 60 functions as a gate electrode for controlling the transistor.

The element isolation region 50 is in contact with the gate insulating film 20 and a portion of the charge storage layer 30 on the gate insulating film 20 side. The element isolation region 50 is further in contact with the semiconductor region 10. The insulating layer 70 is provided between adjacent ones of the plurality of control gate electrodes 60. The insulating layer 70 is in contact with the IPD film 40, the charge storage layer 30, and the gate insulating film 20. For example, as shown in FIG. 2B, the insulating layer 70 covers the side wall 32*w* of the charge storage layer 30.

That is, the upper surface 30*u* and the side wall 32*w* of the charge storage layer 30 are covered with an insulator including the IPD film 40 and the insulating layer 70. Thereby, the charge stored in the charge storage layer 30 is prevented from leaking to the control gate electrode 60.

The material of the semiconductor region 11 is silicon doped with boron (B) and/or the like. The material of the semiconductor region 10 is silicon doped with phosphorus (P), arsenic (As), and/or the like. The gate insulating film 20 may be a NON film like that shown in FIG. 3 in which a silicon nitride film 20*a*, a silicon oxide film 20*b*, and a silicon nitride film 20*c* are stacked in this order, or may be a single-layer film of a silicon oxide film or a silicon nitride film. The illustration of the gate insulating film 20 is only an example, and the gate insulating film 20 is not limited to this structure.

The material of the element isolation region 50 and the insulating layer 70 is, for example, silicon oxide ($SiO_2$). The material of the control gate electrode 60 is, for example, polysilicon containing a p-type impurity. Alternatively, the material of the control gate electrode 60 may be a metal such as tungsten, a metal silicide, or the like.

As shown in FIG. 3, the upper end 32u and the side wall 32w of the silicide-containing layer 32 are covered by the IPD film 40. The IPD film 40 includes a nitride film 40a (a second nitride film) in contact with the silicide-containing layer 32, an oxide film 40b covering the nitride film 40a, and a nitride film 40c covering the oxide film 40b.

The material of the nitride film 40a is titanium silicon nitride (SiTIN), titanium nitride (TiN), or the like. The material of the oxide film 40b is silicon oxide ($SiO_2$) or the like. The material of the nitride film 40c is silicon nitride (SiN) or the like.

In the embodiment, the p type may be taken as a first conductivity type and the n type may be taken as a second conductivity type, or the n type may be taken as the first conductivity type and the p type may be taken as the second conductivity type. As the p-type impurity element, for example, boron (B) is given. As the n-type impurity element, for example, phosphorus (P) and arsenic (As) are given.

The manufacturing process of the nonvolatile semiconductor memory device 1 will now be described.

The method for forming films and layers described below is, unless otherwise specified, appropriately selected from CVD (chemical vapor deposition), the sputtering method, the ALD (atomic layer deposition) method, the epitaxial method, the spin coating method, etc. The removal of films and layers is appropriately selected from dry etching such as RIE (reactive ion etching), wet etching using a hydrofluoric acid solution, an alkaline solution, or the like, and ashing using an oxygen-containing gas.

FIG. 4A to FIG. 11B are schematic views showing the manufacturing process of the nonvolatile semiconductor memory device according to the first embodiment.

Of FIG. 4A to FIG. 11B, the drawings of the numbers including "A" show a cross section corresponding to line A-A' of FIG. 1, and the drawings of the numbers including "B" show a plan view.

Figure 4A:
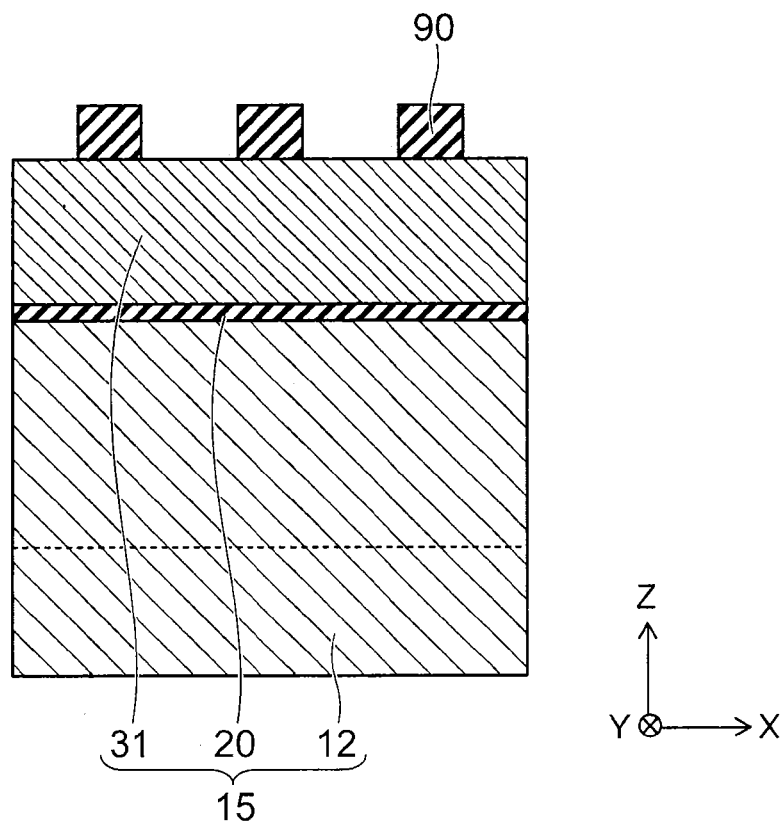
FIG. 4A to FIG. 11B are schematic views showing the manufacturing process of the nonvolatile semiconductor memory device according to the first embodiment.
Figure 4B:
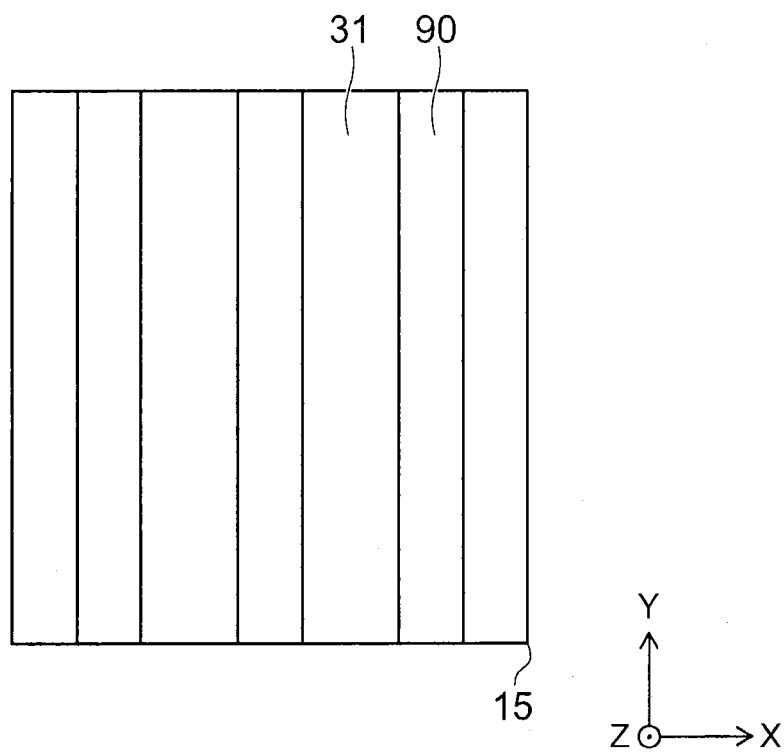

First, as shown in FIG. 4A and FIG. 4B, a stacked body 15 is prepared. The stacked body 15 includes the semiconductor layer 12, the gate insulating film 20 provided on the semiconductor layer 12, and the silicon-containing layer 31 provided on the gate insulating film 20. The stacking direction of the stacked body 15 is the Z direction. Subsequently, a plurality of mask layers 90 extending in the Y direction and arranged in a direction (e.g. the X direction) crossing the Y direction are formed on the stacked body 15.

The patterning of the mask layer 90 is performed by, for example, photolithography and etching. As the material of the mask layer 90, a material having a high processing selectivity to the semiconductor is selected. For example, the material of the mask layer 90 is silicon oxide ($SiO_2$), silicon nitride (SiN), a resist, a material other than these, or a material in which these materials are stacked.

Figure 5A:
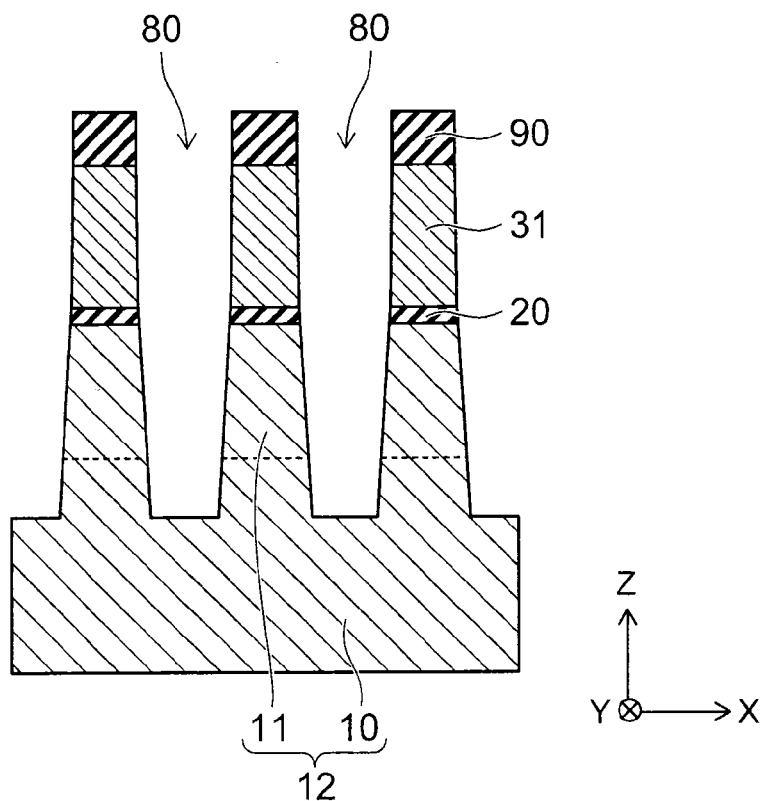
Figure 5B:
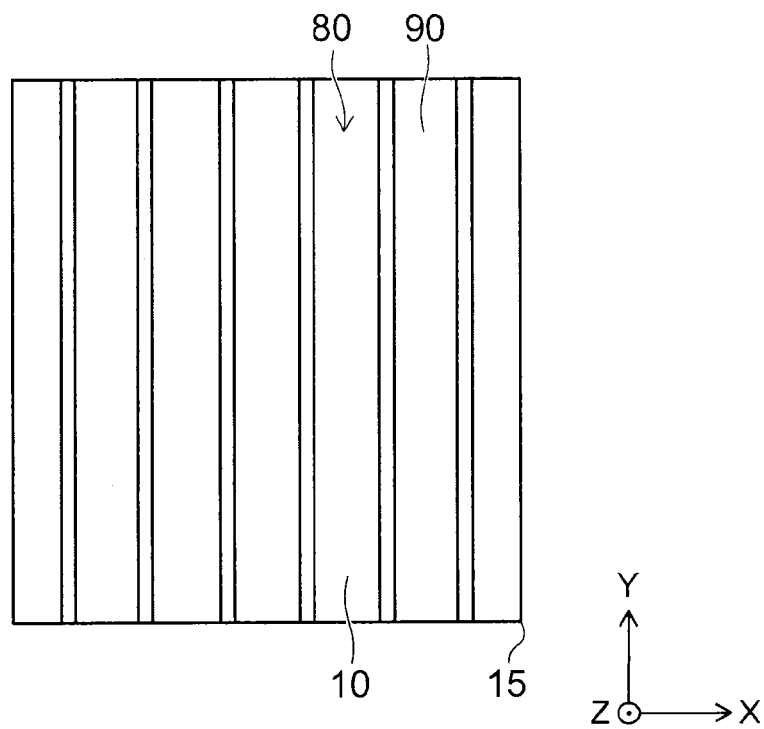

Next, as shown in FIG. 5A and FIG. 5B, etching is performed on the stacked body 15 exposed from the plurality of mask layers 90. Thereby, a plurality of trenches 80 extending in the Y direction are formed in the semiconductor layer 12. Consequently, the semiconductor region 11 sandwiched by adjacent ones of the plurality of trenches 80 is formed. The width of the silicide-containing layer 32 in the X direction is adjusted to 5 nm or less. The gate insulating film 20 extending in the Y direction is formed on the semiconductor region 11, and the silicon-containing layer 31 extending in the Y direction is formed on the gate insulating film 20.

Figure 6A:
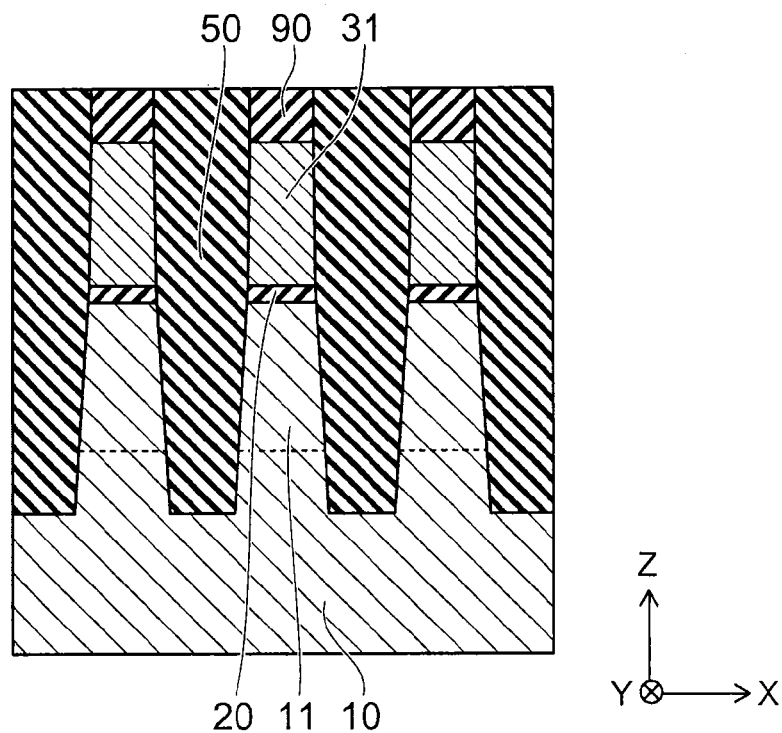
Figure 6B:
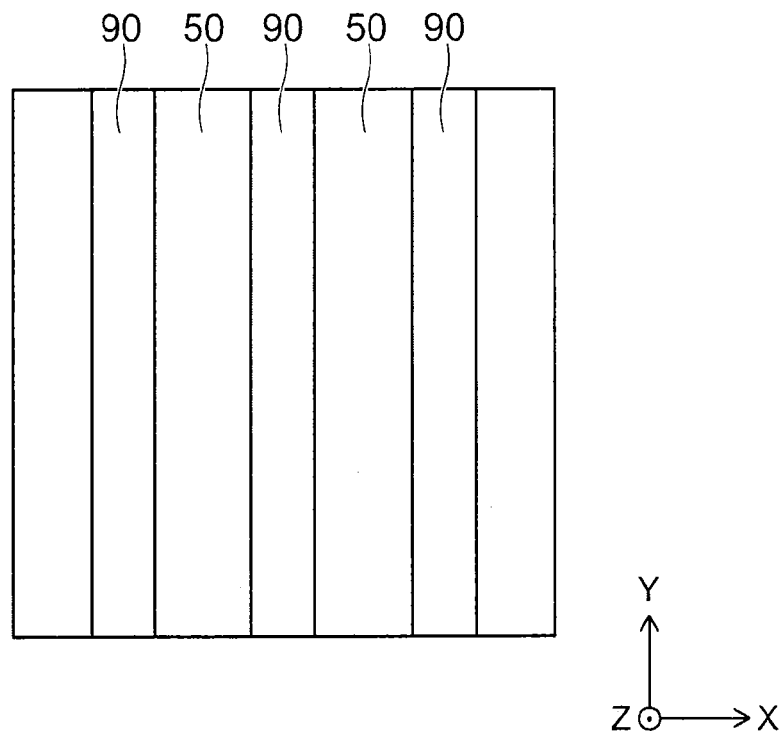

Next, as shown in FIG. 6A and FIG. 6B, the element isolation region 50 is formed in each of the plurality of trenches 80.

Figure 7A:
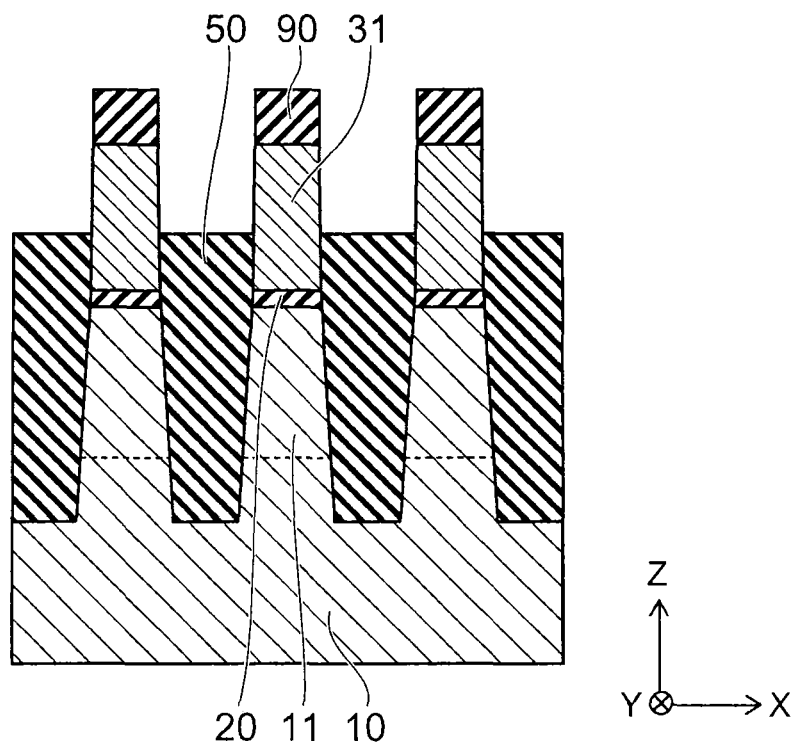
Figure 7B:
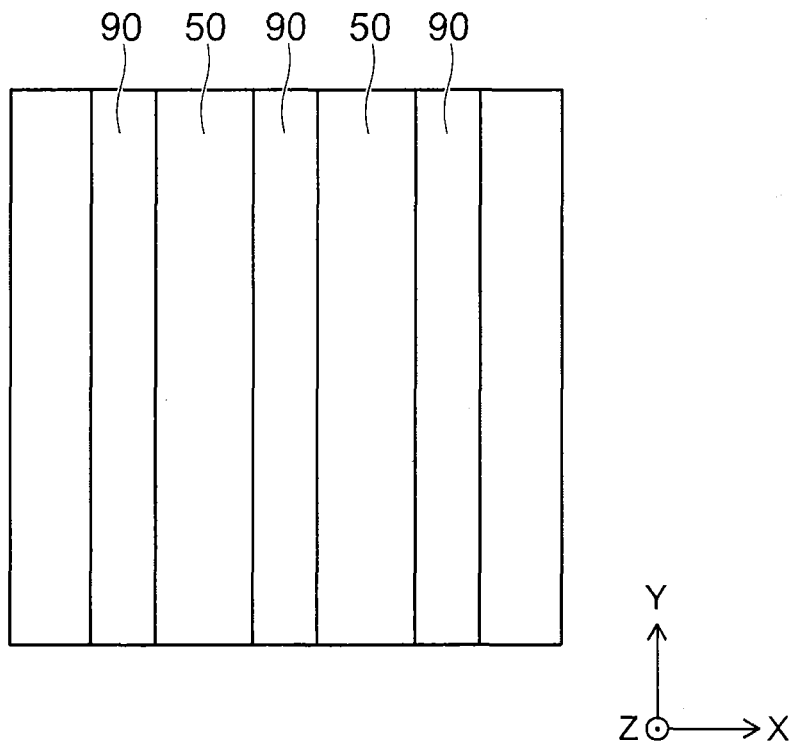

Next, as shown in FIG. 7A and FIG. 7B, the element isolation region 50 is etched back. Thereby, the element isolation region 50 in contact with the semiconductor region 11, the gate insulating film 20, and a portion of the silicon-containing layer 31 on the gate insulating film 20 side is formed in each of the plurality of trenches 80. After that, the mask layer 90 is removed. Then, the natural oxide film formed on the surface of the silicon-containing layer 31 is removed.

Figure 8A:
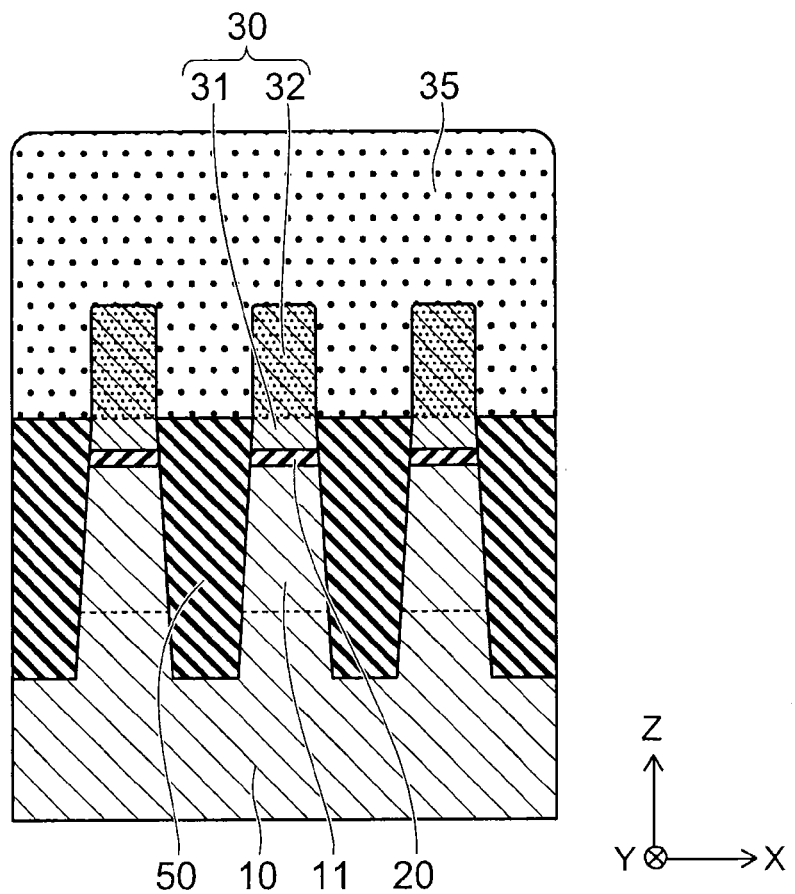
Figure 8B:
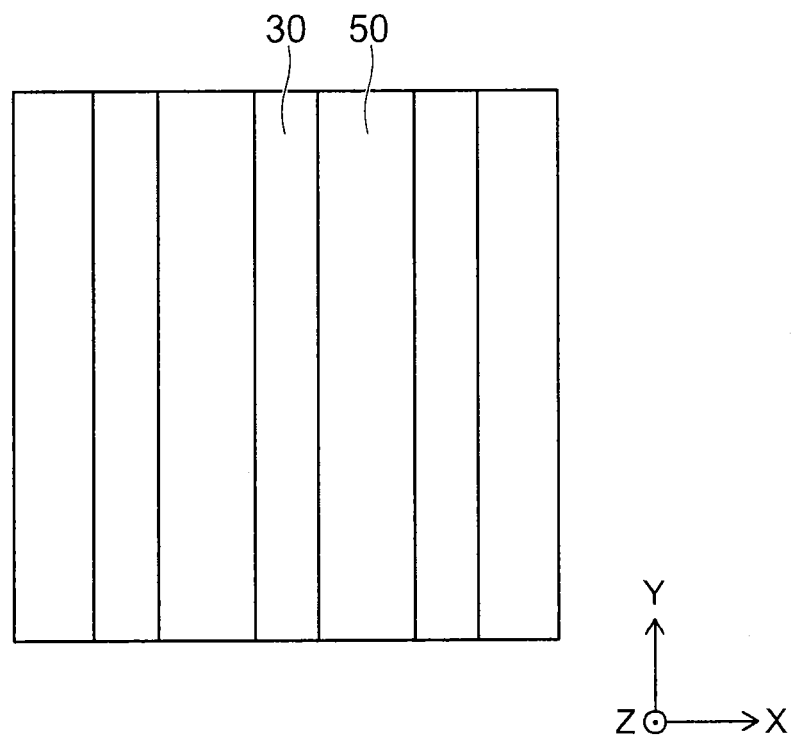

Next, the portion exposed from the element isolation region 50 of the silicon-containing layer 31 is exposed to a metal element-containing gas 35. Then, the silicon-containing layer 31 is heated. FIG. 8A and FIG. 8B show the state after the silicon-containing layer 31 is exposed to the metal element-containing gas 35.

As the metal element-containing gas 35, for example, a metal chloride is used. As the metal chloride, for example, titanium tetrachloride ($TiCl_4$) is given. As the metal chloride, also a chloride of at least one metal selected from nickel (Ni), cobalt (Co), molybdenum (Mo), and tungsten (W) may be used. The heating temperature is not less than 500° C. and not more than 600° C.

The metal (e.g. Ti) in the metal chloride selectively reacts more with the silicon-containing layer 31 than with the element isolation region 50. Consequently, part of the silicon-containing layer 31 is made into a silicide. That is, the charge storage layer 30 including the silicon-containing layer 31 and the silicide-containing layer 32 is formed on the gate insulating film 20. In the case where titanium tetrachloride is used, the silicide-containing layer 32 contains, for example, titanium silicide (TiSi).

Figure 9A:
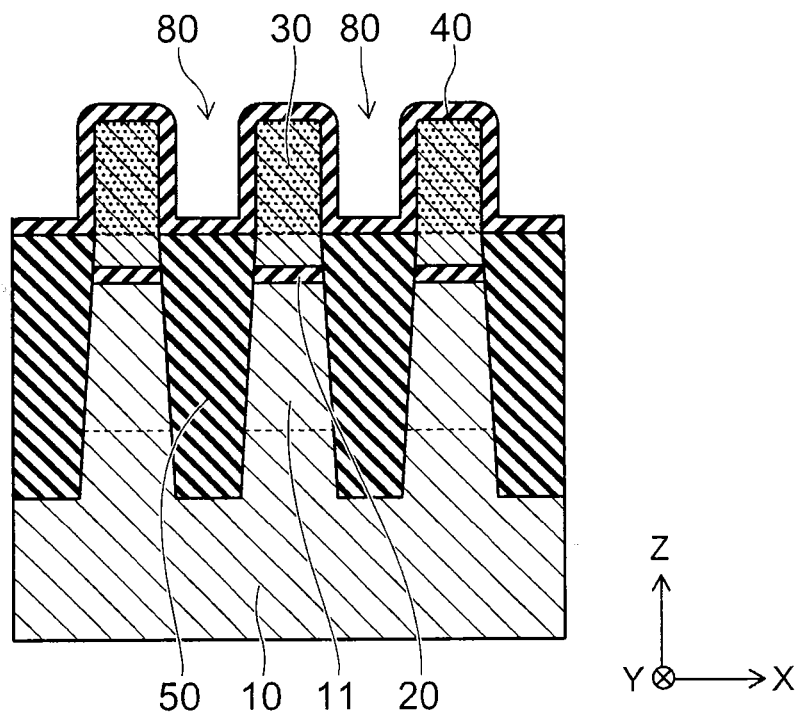
Figure 9B:
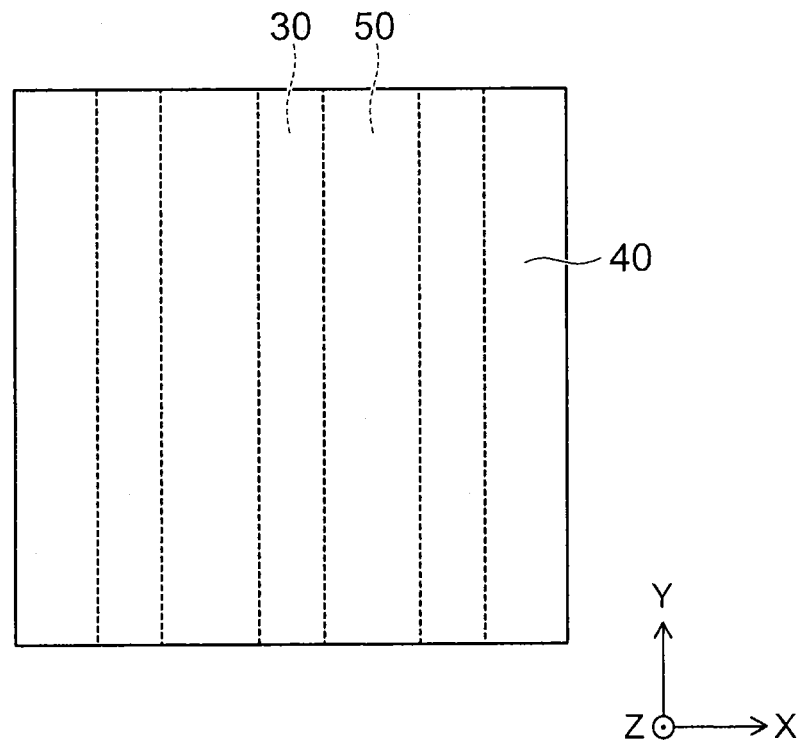

Subsequently, after part of the silicon-containing layer 31 is made into a silicide, the silicon-containing layer that has become a silicide is exposed to a nitrogen-containing gas. Thereby, the surface of the charge storage layer 30 exposed from the element isolation region 50 is nitrided (see the nitride film 40a of FIG. 3). Then, the oxide film 40b and the nitride film 40c are formed. Thereby, the IPD film 40 including the nitride film 40a, the oxide film 40b, and the nitride film 40c is formed. FIG. 9A and FIG. 9B show this state.

As shown in FIG. 9A and FIG. 9B, the portion exposed from the element isolation region 50 of the charge storage layer 30 is covered by the IPD film 40.

Figure 10A:
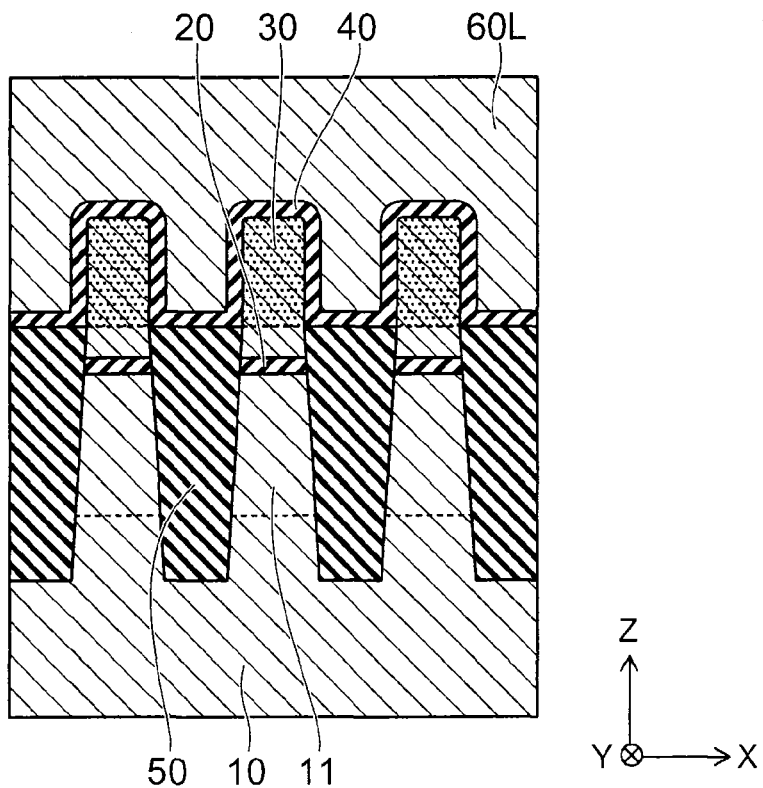
Figure 10B:
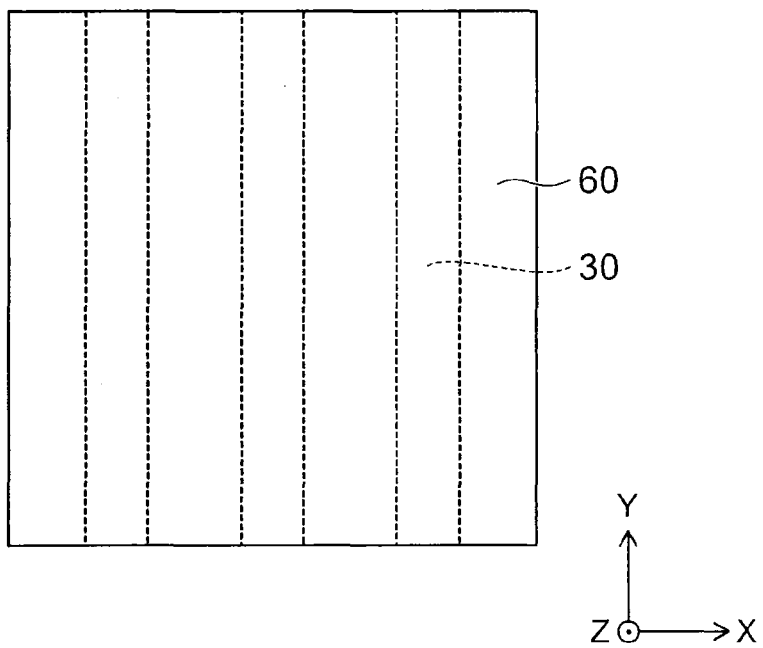

Next, as shown in FIG. 10A and FIG. 10B, a control gate electrode layer 60L is formed in each of the plurality of trenches 80 and on the charge storage layer 30 via the IPD film 40.

Figure 11A:
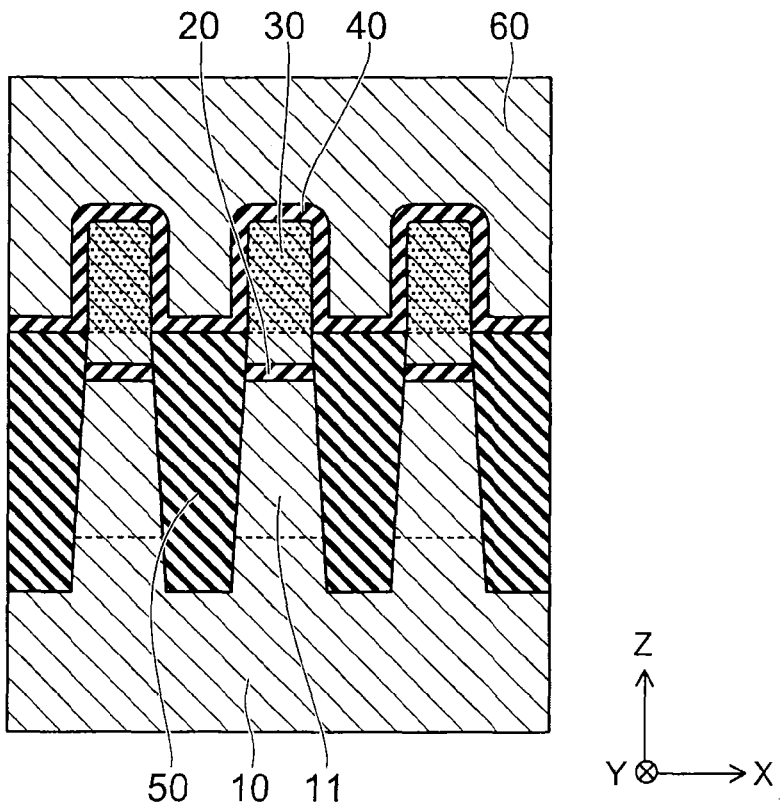
Figure 11B:
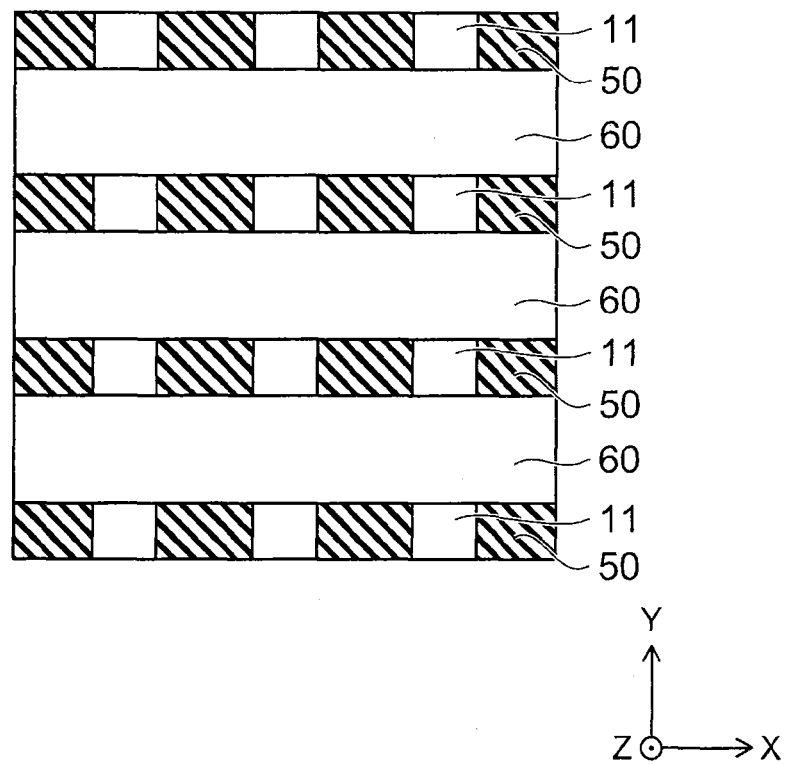

Next, as shown in FIG. 11A and FIG. 11B, the control gate electrode layer 60L is divided into a plurality of control gate electrodes 60. The control gate electrode layer 60L is divided by photolithography and etching. After the division, the plurality of control gate electrodes 60 extend in the X direction, and are arranged in the Y direction. After that, the insulating layer 70 is formed on the semiconductor region 11 between adjacent ones of the plurality of control gate electrodes 60 (see FIG. 2B). By such a manufacturing process, the nonvolatile semiconductor memory device 1 is formed.

Figure 12:
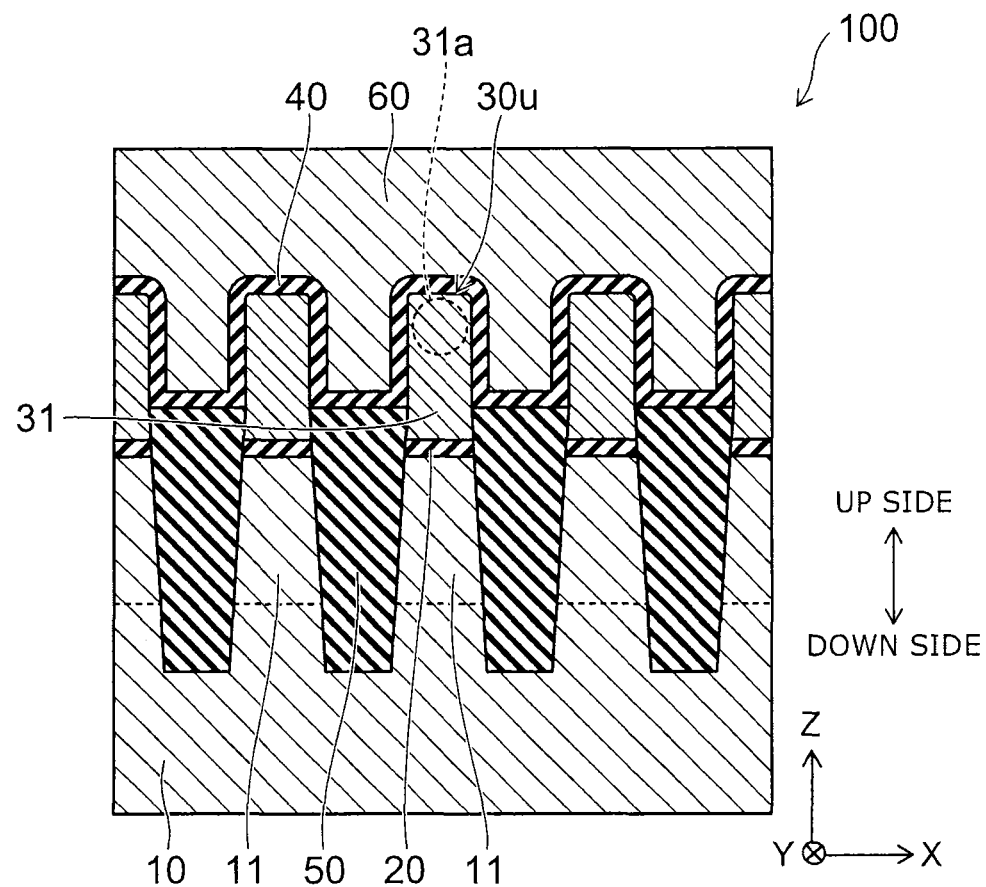
FIG. 12 is a schematic cross-sectional view showing a nonvolatile semiconductor memory device according to a reference example.

FIG. 12 is a schematic cross-sectional view showing a nonvolatile semiconductor memory device according to a reference example.

In a nonvolatile semiconductor memory device 100 according to the reference example, the charge storage layer is a single layer. The charge storage layer of the reference example is formed of the silicon-containing layer 31.

A case is assumed where, for example, in the nonvolatile semiconductor memory device 100, miniaturization has progressed and the width in the X direction of the silicon-containing layer 31 has become minute (e.g. 5 nm or less).

In this case, for example, when in the time of the writing of data a positive potential is applied to the control gate electrode 60 and a negative potential (or the ground potential) is applied to the semiconductor region 11, depletion is likely to occur in the upper portion 31a of the silicon-containing layer 31. This is because the silicon-containing layer 31 is very fine and the electric field is likely to concentrate at the upper end of the silicon-containing layer 31.

There are few carriers in the depletion layer. Therefore, in the time of the writing of data, an insulating layer of the thicknesses of the IPD film 40 and the depletion layer (the upper portion 31a) exists on the silicon-containing layer 31. In other words, in the time of the writing of data, the substantial thickness of the silicon-containing layer 31 is the thickness excluding that of the depletion layer (the upper portion 31a). That is, a charge cannot be stored in the portion where the depletion layer is formed.

Therefore, in the nonvolatile semiconductor memory device 100, the silicon-containing layer 31 cannot be made to sufficiently function as a charge storage layer, and the stability of data writing is not sufficient. Furthermore, also in the time of data reading, depletion in the upper portion 31a of the silicon-containing layer 31 is likely to occur, and the stability of data reading is not sufficient. For example, a Vth jump phenomenon may occur in which the threshold voltage (Vth) in data reading rises steeply. Thus, it is preferable to suppress the depletion in the upper portion of the charge storage layer.

As a first means for suppressing the depletion in the upper portion of the charge storage layer, there may be a means in which the concentration of the impurity element contained in the charge storage layer is increased. This is because the increase in the impurity element concentration decreases the resistivity of the charge storage layer and suppresses the extension of the depletion layer.

For example, there is a means in which a high concentration impurity element is introduced into the upper portion of the charge storage layer by plasma doping. However, when plasma is used, the very fine charge storage layer is damaged and a good quality charge storage layer is not formed.

As a second means, there may be a means in which the silicon-containing layer 31 of the stacked body 15 is replaced with a metal layer (or a silicide layer). That is, it is a means in which a stacked body composed of the semiconductor layer 12/the gate insulating film 20/a metal layer (or a silicide layer) is prepared before the trench 80 is formed. By this means, the charge storage layer is made of a metal (or a silicide), and it can be foreseen that the depletion in the upper portion of the charge storage layer will be suppressed.

However, when this means is employed, during forming the trench 80, the metal or silicide that is a component of the charge storage layer may go through the trench 80 to adhere to the semiconductor regions 10 and 11 as a residue, and the attached metal or silicide may diffuse into the semiconductor regions 10 and 11. Consequently, the electric conductivity, conductivity type, etc. of the semiconductor regions 10 and 11 may be changed to cause a loss to the function as an active area of the semiconductor region 11.

In contrast, in the first embodiment, the lower side of the charge storage layer 30 is formed of the silicon-containing layer 31 and the upper side of the charge storage layer 30 is formed of the silicide-containing layer 32. The resistivity of the silicide-containing layer 32 is lower than the resistivity of the silicon-containing layer 31. Therefore, in the time of data writing and reading, the depletion in the upper portion of the charge storage layer 30 is suppressed. Thus, data writing and reading are stabilized.

The formation of the silicide-containing layer 32 is performed not by plasma doping but by a thermal reaction. Therefore, the charge storage layer 30 is less likely to be damaged in the process and a good quality charge storage layer is formed. Furthermore, the silicide-containing layer 32 is a salicide (self aligned silicide) layer formed by exposing the silicon-containing layer 31 to a reaction gas. Therefore, even when miniaturization progresses by generations, the process of making a silicide follows the miniaturization by generations. Consequently, a charge storage layer with a narrow pitch and a very fine size is formed by generations.

In the first embodiment, the stacked body 15 before forming the trench 80 only includes the silicon-containing layer 31. Hence, when the trench 80 is formed, there is no case where a metal or a silicide adheres to the semiconductor regions 10 and 11 as a residue. Even if a component of the silicon-containing layer 31 adheres to the semiconductor regions 10 and 11, there is no problem because the main component of the silicon-containing layer 31 and the main component of the semiconductor regions 10 and 11 are both the same silicon (Si). Thereby, the electric conductivity, conductivity type, etc. of the semiconductor regions 10 and 11 are less likely to be changed, and the function as an active area of the semiconductor region 11 is not lost.

In the nonvolatile semiconductor memory device 1, not only is the control gate electrode 60 in contact with the upper end of the charge storage layer 30 via the IPD film 40, but the control gate electrode 60 is also in contact with the side wall 32w of the charge storage layer 30 via the IPD film 40. Thus, the charge storage state of the charge storage layer 30 is evenly reflected on the control gate electrode 60.

Before the insulating layer 70 is buried, infrastructure processing for forming the source/drain is performed. The source/drain regions are not shown.

Second Embodiment

Figure 13:
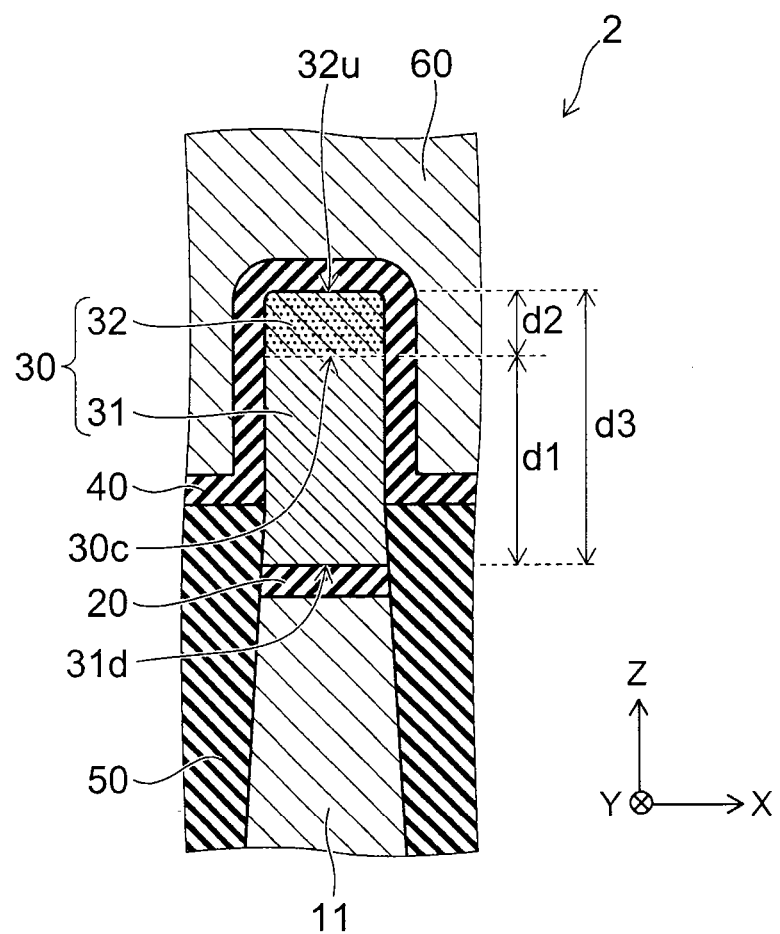
FIG. 13 is a schematic cross-sectional view showing a nonvolatile semiconductor memory device according to a second embodiment.

FIG. 13 is a schematic cross-sectional view showing a nonvolatile semiconductor memory device according to a second embodiment.

FIG. 13 is an enlarged schematic cross-sectional view of the charge storage layer and the surroundings of the charge storage layer.

The basic structure of a nonvolatile semiconductor memory device 2 is the same as the basic structure of the nonvolatile semiconductor memory device 1. However, the ratio between the thickness of the silicon-containing layer 31 and the thickness of the silicide-containing layer 32 is different from the ratio between the thickness of the silicon-containing layer 31 and the thickness of the silicide-containing layer 32 in the nonvolatile semiconductor memory device 1.

In the nonvolatile semiconductor memory device 2, the length d1 from the lower end 31d of the silicon-containing layer 31 to the junction 30c between the silicon-containing layer 31 and the silicide-containing layer 32 is longer than the length d2 from the junction 30c to the upper end 32u of the silicide-containing layer 32 (corresponding to the thickness of the silicide-containing layer 32 in the Z direction). That is, the thickness in the Z direction of the silicon-containing layer 31 is thicker than the thickness in the Z direction of the silicide-containing layer 32.

For example, the length d2 is not less than 10% and not more than 20% of the length d3 from the lower end of the charge storage layer 30 (corresponding to the lower end 31d of the silicon-containing layer 31) to the upper end of the charge storage layer 30 (the upper end 32u of the silicide-containing layer 32). That is, the thickness in the Z direction of the silicide-containing layer 32 is not less than 10% and not more than 20% of the thickness in the Z direction of the charge storage layer 30. The length d2 is set to, for example, the thickness in the Z direction of the depletion layer in the reference example.

Figure 14A:
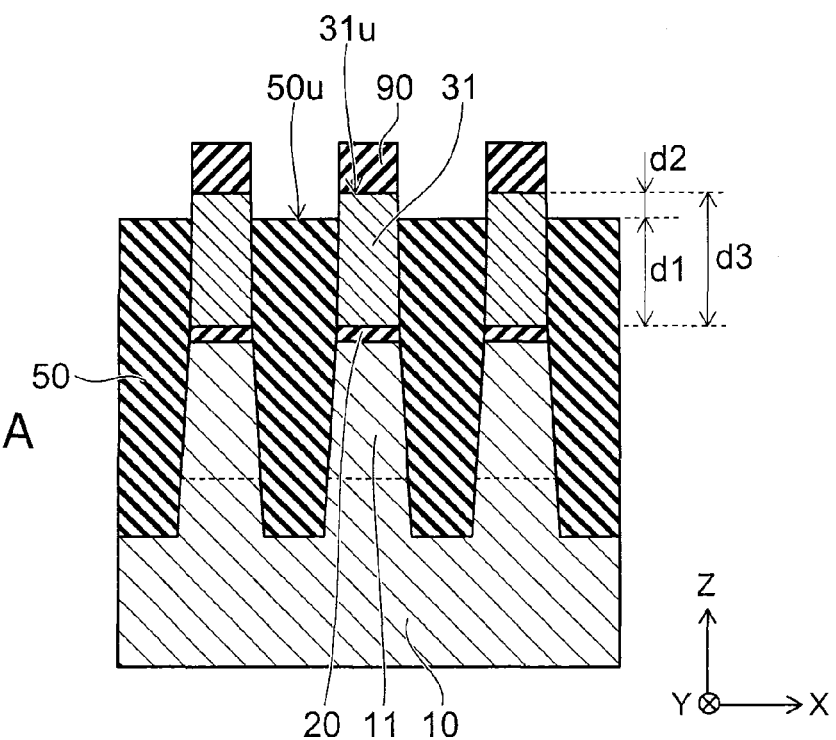
FIG. 14A and FIG. 14B are schematic cross-sectional views showing the manufacturing process of the nonvolatile semiconductor memory device according to the second embodiment.
Figure 14B:
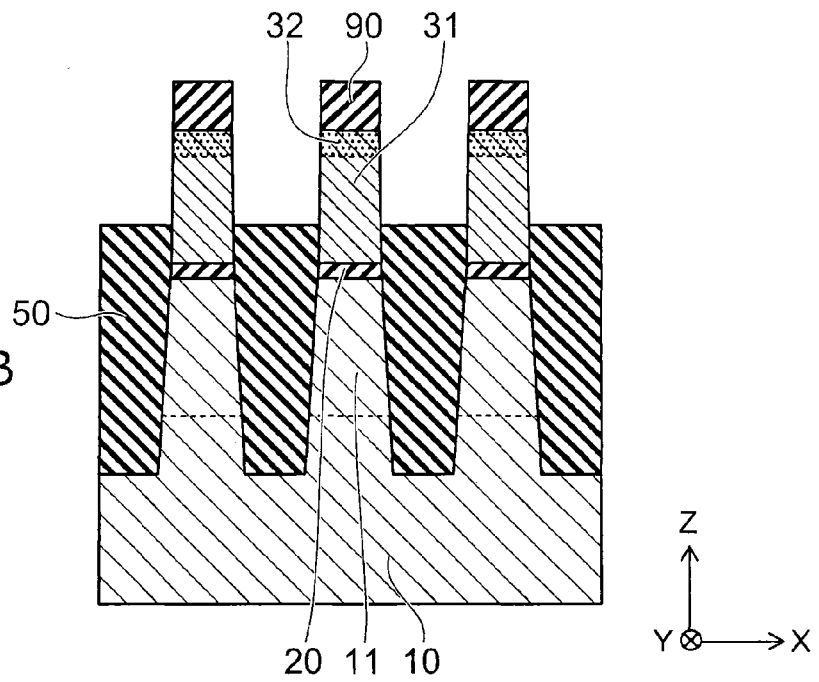

FIG. 14A and FIG. 14B are schematic cross-sectional views showing the manufacturing process of the nonvolatile semiconductor memory device according to the second embodiment.

The manufacturing process of the nonvolatile semiconductor memory device 2 is basically the same as the manufacturing process of the nonvolatile semiconductor memory device 1. However, in the manufacturing process of the nonvolatile semiconductor memory device 2, the etchback of the element isolation region 50 is performed at least two times. That is, the etchback of the element isolation region 50 includes the first etchback processing and the second etchback processing.

For example, the first etchback processing is performed from the state of FIG. 6A and FIG. 6B. Thereby, the element isolation region 50 shown in FIG. 14A is obtained. In this stage, the upper end 50u of the element isolation region 50 is located at a depth of d2 from the upper end 31u of the silicon-containing layer 31.

The length d2 in the Z direction of the portion of the silicon-containing layer 31 exposed from the element isolation region 50 by the first etchback processing is shorter than the length d1 in the Z direction of the portion of the silicon-containing layer 31 not exposed from the element isolation region 50.

For example, the length d2 in the Z direction of the portion of the silicon-containing layer 31 exposed from the element isolation region 50 by the first etchback processing is adjusted to not less than 10% and not more than 20% of the length in the Z direction of the silicon-containing layer 31.

Subsequently, after the first etchback processing, the portion exposed from the element isolation region 50 of the silicon-containing layer 31 is exposed to a metal element-containing gas (e.g. $TiCl_4$). Thereby, a portion of the silicon-containing layer 31 extending approximately d2 in depth from the upper end 31u of the silicon-containing layer 31 is changed into the silicide-containing layer 32.

After that, the second etchback processing is performed on the element isolation region 50. FIG. 14B shows this state. In this stage, the element isolation region 50 in contact with the semiconductor region 11, the gate insulating film 20, and a portion of the silicon-containing layer 31 on the gate insulating film 20 side is formed. After that, the IPD film 40 is formed. By such a manufacturing process, the nonvolatile semiconductor memory device 2 is formed.

In the nonvolatile semiconductor memory device 2, since the portion where the depletion layer is formed in the reference example is replaced with the silicide-containing layer 32, depletion can be suppressed similarly to the nonvolatile semiconductor memory device 1. The nonvolatile semiconductor memory device 2 exhibits similar effects to the nonvolatile semiconductor memory device 1. In addition, the nonvolatile semiconductor memory device 2 exhibits the following effect.

The resistivity of the silicide-containing layer 32 is lower than the resistivity of the silicon-containing layer 31. Therefore, after data writing, electrons are preferentially stored more in the silicide-containing layer 32 than in the silicon-containing layer 31.

In the nonvolatile semiconductor memory device 2, the junction 30c between the silicon-containing layer 31 and the silicide-containing layer 32 is located more on the upper side than in the nonvolatile semiconductor memory device 1. In other words, in the nonvolatile semiconductor memory device 2, the junction 30c is located more on the upper side than in the nonvolatile semiconductor memory device 1. The silicide-containing layer 32 of the nonvolatile semiconductor memory device 2 is more away from the semiconductor region 11 than the silicide-containing layer 32 of the nonvolatile semiconductor memory device 1.

Therefore, in the nonvolatile semiconductor memory device 2, after data writing, electrons stored in the silicide-containing layer 32 are less likely to be released to the semiconductor region 11. That is, the data retention ability of the nonvolatile semiconductor memory device 2 is further increased as compared to the data retention ability of the nonvolatile semiconductor memory device 1.

Third Embodiment

Figure 15:
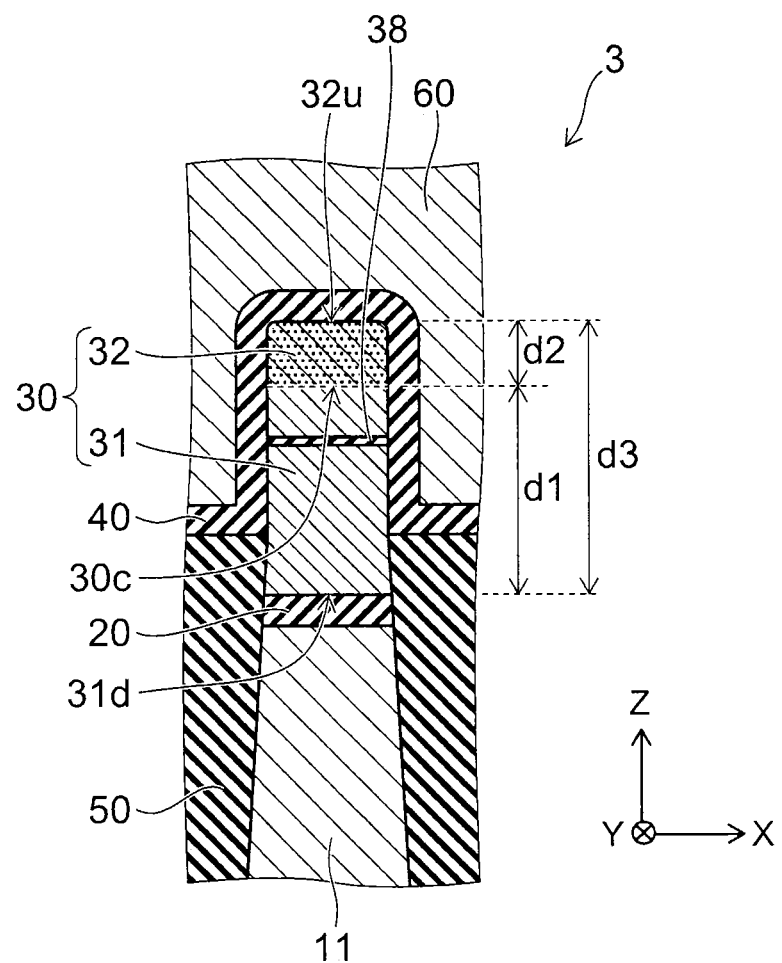
FIG. 15 is a schematic cross-sectional view showing a nonvolatile semiconductor memory device according to a third embodiment.

FIG. 15 is a schematic cross-sectional view showing a nonvolatile semiconductor memory device according to a third embodiment.

The basic structure of a nonvolatile semiconductor memory device 3 is the same as the basic structure of the nonvolatile semiconductor memory device 2. However, the charge storage layer 30 of the nonvolatile semiconductor memory device 3 includes a nitride film 38 (a first nitride film). The nitride film (SiN) 38 is provided on the lower side of the silicide-containing layer 32. Although FIG. 15 illustrates a state where the silicide-containing layer 32 and the nitride film 38 are apart, the nitride film 38 may be in contact with the silicide-containing layer 32.

The nitride film 38 functions as a barrier film that suppresses the diffusion of the impurity element (e.g. boron) contained in the silicon-containing layer 31 to the silicide-containing layer 32. The thickness of the nitride film 38 is so adjusted that electrons can pass through the nitride film 38. The thickness of the nitride film 38 is, for example, in the order of atoms.

Figure 16:
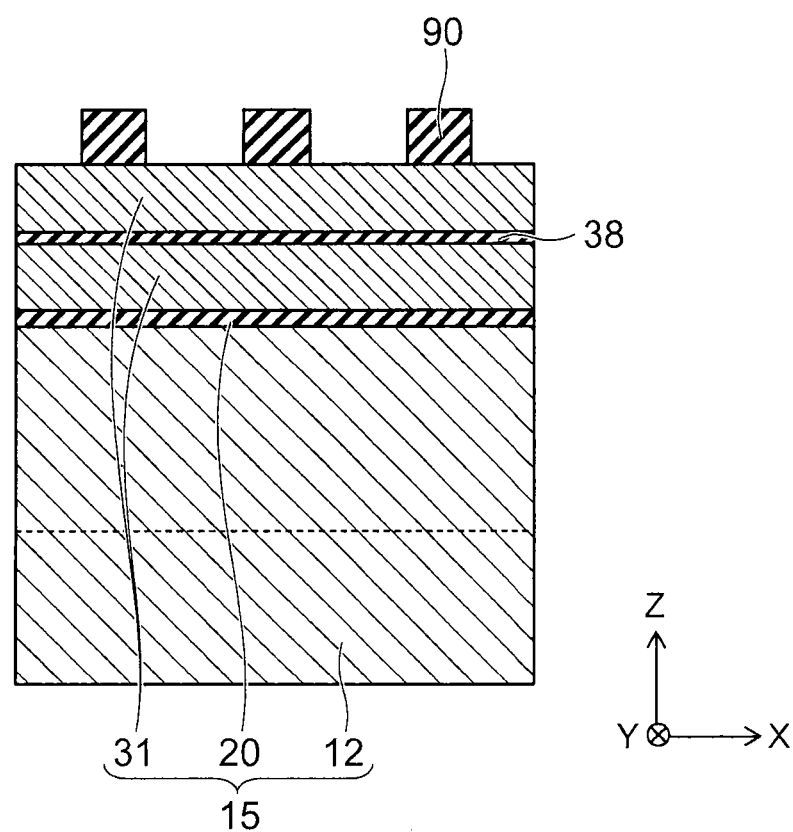
FIG. 16 to FIG. 17B are schematic cross-sectional views showing the manufacturing process of the nonvolatile semiconductor memory device according to the third embodiment.
Figure 17A:
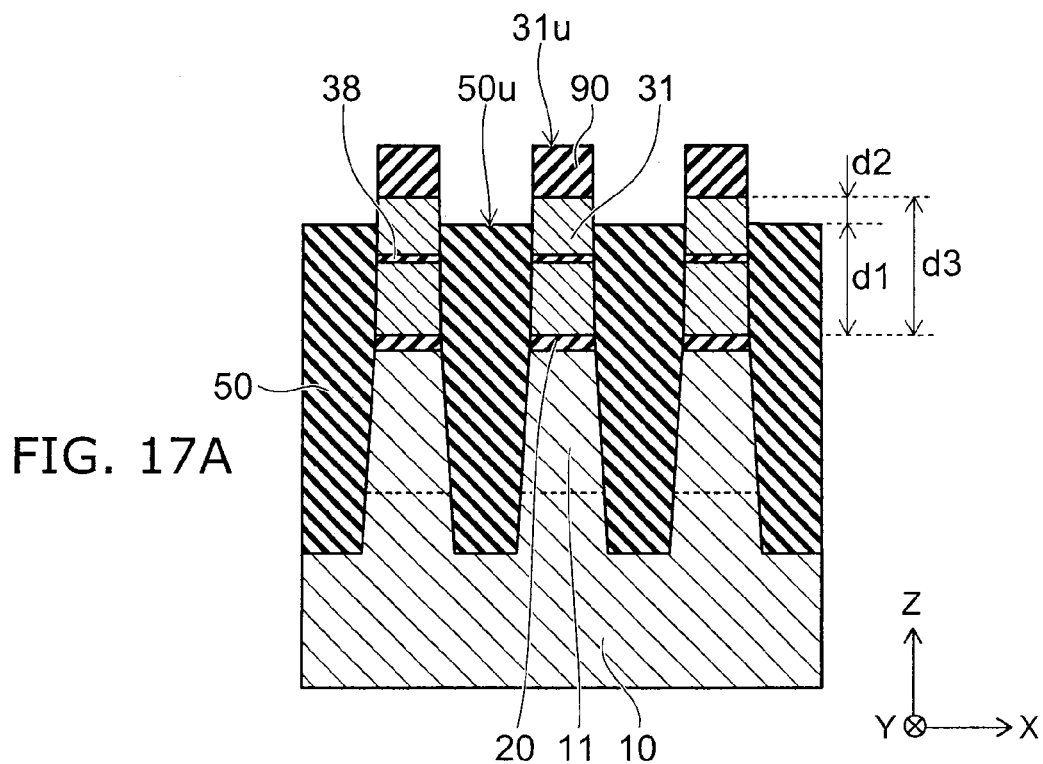
Figure 17B:
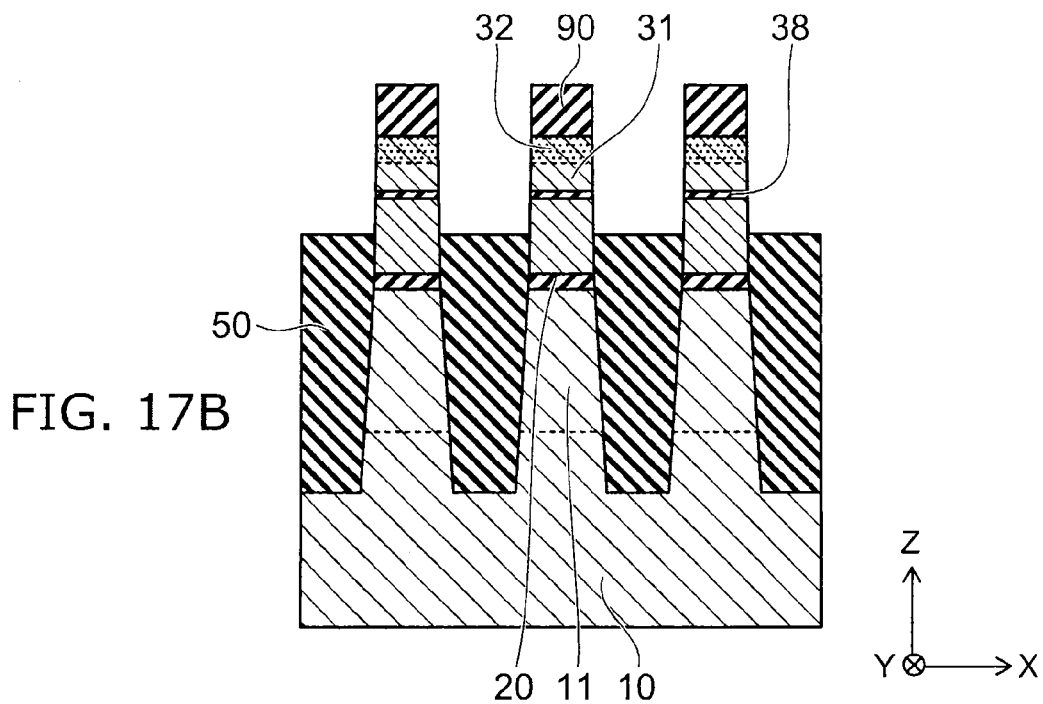

FIG. 16 to FIG. 17B are schematic cross-sectional views showing the manufacturing process of the nonvolatile semiconductor memory device according to the third embodiment.

First, as shown in FIG. 16, the stacked body 15 including the silicon-containing layer 31 including the nitride film 38 is prepared. In the stacked body 15, the silicon-containing layer 31 is provided on the upper and lower sides of the nitride film 38. After that, the processes described in FIG. 5 and FIG. 6 are performed.

Next, as shown in FIG. 17A and FIG. 17B, the etchback of the element isolation region 50 is performed at least two times.

For example, the first etchback processing is performed. Thereby, the element isolation region 50 shown in FIG. 17A is obtained. In this stage, the upper end 50u of the element isolation region 50 is located at a depth of d2 from the upper end 31u of the silicon-containing layer 31.

The length d2 in the Z direction of the portion of the silicon-containing layer 31 exposed from the element isolation region 50 by the first etchback processing is shorter than the length d1 in the Z direction of the portion of the silicon-containing layer 31 not exposed from the element isolation region 50. The position of the upper end 50u of the element isolation region 50 is adjusted to a position higher than the position of the nitride film 38.

Subsequently, after the first etchback processing, the portion exposed from the element isolation region 50 of the silicon-containing layer 31 is exposed to a metal element-containing gas (e.g. $TiCl_4$). A portion of the silicon-containing layer 31 on the upper side of the nitride film 38 is exposed to the metal element-containing gas. Thereby, a portion of the silicon-containing layer 31 extending approximately d2 in depth from the upper end 31$u$ of the silicon-containing layer 31 is changed into the silicide-containing layer 32.

After that, the second etchback processing is performed on the element isolation region 50. FIG. 17B shows this state. In this stage, the element isolation region 50 in contact with the semiconductor region 11, the gate insulating film 20, and a portion of the silicon-containing layer 31 on the gate insulating film 20 side is formed. After that, the IPD film 40 is formed. By such a manufacturing process, the nonvolatile semiconductor memory device 3 is formed.

Also in the nonvolatile semiconductor memory device 3, similar effects to the nonvolatile semiconductor memory device 2 are exhibited. In addition, the nonvolatile semiconductor memory device 3 exhibits the following effects.

A case is assumed where, for example, titanium (Ti) is contained in the silicide-containing layer 32. In this case, due to the affinity between titanium and boron (B) contained in the silicon-containing layer 31, the silicide-containing layer 32 may absorb boron in the silicon-containing layer 31 to form titanium boride (TiB) in the silicide-containing layer 32. The titanium boride exhibits insulating properties, and the resistivity of the silicide-containing layer 32 may be increased. Thus, it is preferable to suppress the diffusion of boron from the silicon-containing layer 31 to the silicide-containing layer 32.

In the nonvolatile semiconductor memory device 3, the nitride film 38 functioning as a barrier film is provided on the lower side of the silicide-containing layer 32. Therefore, the diffusion of boron from the silicon-containing layer 31 to the silicide-containing layer 32 is suppressed by the nitride film 38.

In the nonvolatile semiconductor memory device 3, by providing the nitride film 38, the impurity concentration of the silicon-containing layer 31 can be increased as compared to the impurity concentration of the silicon-containing layer 31 of the nonvolatile semiconductor memory devices 1 and 2. This means, to the electrons stored in the silicide-containing layer 32, that the barrier at the junction 30$c$ becomes higher. Consequently, electrons stored in the silicide-containing layer 32 after writing are less likely to diffuse to the semiconductor region 11, and the data retention ability is further increased.

Hereinabove, embodiments are described with reference to specific examples. However, the embodiment is not limited to these specific examples. That is, one skilled in the art may appropriately make design modifications to these specific examples, and such modifications also are included in the scope of the embodiment to the extent that the spirit of the embodiment is included. The components of the specific examples described above and the arrangement, material, conditions, shape, size, etc. thereof are not limited to those illustrated but may be appropriately altered.

The term "on" in "a portion A is provided on a portion B" refers to the case where the portion A is provided on the portion B such that the portion A is in contact with the portion B and the case where the portion A is provided above the portion B such that the portion A is not in contact with the portion B.

Furthermore, components of the embodiments described above may be combined within the extent of technical feasibility, and combinations of them also are included in the scope of the embodiment to the extent that the spirit of the embodiment is included. Furthermore, one skilled in the art may arrive at various alterations and modifications within the idea of the embodiment. Such alterations and modifications should be seen as within the scope of the embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nonvolatile semiconductor memory device comprising:
   a plurality of first semiconductor regions extending in a first direction, the plurality of first semiconductor regions being arranged in a direction crossing the first direction;
   a plurality of control gate electrodes provided on an upper side of the plurality of first semiconductor regions, the plurality of control gate electrodes extending in a second direction different from the first direction, and the plurality of control gate electrodes being arranged in a direction crossing the second direction;
   a charge storage layer provided in a position, each of the plurality of first semiconductor regions and each of the plurality of control gate electrodes cross in the position;
   a first insulating film provided between the charge storage layer and each of the plurality of first semiconductor regions;
   a second insulating film provided between the charge storage layer and each of the plurality of control gate electrodes; and
   an element isolation region provided between adjacent ones of the plurality of first semiconductor regions, the element isolation region being in contact with the first insulating film and a first portion of the charge storage layer on the first insulating film side,
   each of the plurality of control gate electrodes being in contact with a second portion other than the first portion of the charge storage layer via the second insulating film,
   the charge storage layer including a silicon-containing layer in contact with the first insulating film and a silicide-containing layer provided on the silicon-containing layer, and
   a length from a lower end of the silicon-containing layer to an upper end of the element isolation region being the same as a length from the lower end of the silicon-containing layer to a junction between the silicon-containing layer and the silicide-containing layer.

2. The device according to claim 1, wherein a width of the silicide-containing layer in the direction crossing the first direction is 5 nm (nanometers) or less.

3. A nonvolatile semiconductor memory device comprising:
   a plurality of first semiconductor regions extending in a first direction, the plurality of first semiconductor regions being arranged in a direction crossing the first direction;
   a plurality of control gate electrodes provided on an upper side of the plurality of first semiconductor regions, the plurality of control gate electrodes extending in a second direction different from the first direction, and the plurality of control gate electrodes being arranged in a direction crossing the second direction;

a charge storage layer provided in a position, each of the plurality of first semiconductor regions and each of the plurality of control gate electrodes crossing in the position;

a first insulating film provided between the charge storage layer and each of the plurality of first semiconductor regions;

a second insulating film provided between the charge storage layer and each of the plurality of control gate electrodes; and an element isolation region provided between adjacent ones of the plurality of first semiconductor regions, the element isolation region being in contact with the first insulating film and a first portion of the charge storage layer on the first insulating film side, each of the plurality of control gate electrodes being in contact with a second portion other than the first portion of the charge storage layer via the second insulating film, the charge storage layer including a silicon-containing layer in contact with the first insulating film, a silicide-containing layer provided on the silicon-containing layer, and a first nitride film provided on a lower side of the silicide-containing layer.

4. The device according to claim 3, wherein a length from a lower end of the silicon-containing layer to a junction between the silicon-containing layer and the silicide-containing layer is longer than a length from the junction to an upper end of the silicide-containing layer.

5. The device according to claim 3, wherein the second insulating film includes a second nitride film in contact with the silicide-containing layer.

6. The device according to claim 3, wherein a width of the silicide-containing layer in the direction crossing the first direction is 5 nm (nanometers) or less.

* * * * *